United States Patent [19]
Wodnicki et al.

[11] Patent Number: 6,037,809
[45] Date of Patent: Mar. 14, 2000

[54] APPARATUS AND METHOD FOR A HIGH FREQUENCY CLOCKED COMPARATOR AND APPARATUS FOR MULTI-PHASE PROGRAMMABLE CLOCK GENERATOR

[75] Inventors: Robert Gideon Wodnicki, Schenectady; Paul Andrew Frank, Albany; Donald Thomas McGrath, Scotia; Daniel David Harrison, Delanson, all of N.Y.

[73] Assignee: General Electric Company, Schenectady, N.Y.

[21] Appl. No.: 09/089,604

[22] Filed: Jun. 2, 1998

[51] Int. Cl.[7] .................................................. H03K 5/153
[52] U.S. Cl. ............................................. 327/77; 327/91
[58] Field of Search .................................. 327/67, 77, 85, 327/87, 89, 337, 91, 93, 94, 96

[56] References Cited

U.S. PATENT DOCUMENTS

| | | | |
|---|---|---|---|
| 3,961,269 | 6/1976 | Alvarez, Jr. | 327/239 |
| 4,516,861 | 5/1985 | Frew et al. | 368/120 |
| 4,568,841 | 2/1986 | Mayhew | 327/176 |
| 4,785,428 | 11/1988 | Bajwa et al. | 365/233 |
| 5,107,140 | 4/1992 | Sherman | 327/331 |
| 5,289,116 | 2/1994 | Kurita et al. | 324/76.11 |
| 5,332,931 | 7/1994 | Crispie et al. | 327/67 |
| 5,394,035 | 2/1995 | Elwell | 327/72 |
| 5,394,541 | 2/1995 | Chesley et al. | 327/172 |
| 5,506,524 | 4/1996 | Lin | 327/57 |
| 5,546,026 | 8/1996 | Lin et al. | 327/54 |
| 5,554,946 | 9/1996 | Curran et al. | 327/67 |
| 5,563,533 | 10/1996 | Cave et al. | 327/172 |
| 5,568,075 | 10/1996 | Curran et al. | 327/172 |
| 5,804,997 | 9/1998 | Nishizono et al. | 327/103 |

*Primary Examiner*—Toan Tran
*Assistant Examiner*—Anh-Quan Tra
*Attorney, Agent, or Firm*—Jill M. Breedlove; Douglas E. Stoner

[57] ABSTRACT

The present invention provides a clocked comparator which extends the time period before an input signal is measured to include most of the clock cycle, thereby increasing the amount of time available for the input signal to achieve a "steady-state" condition. After the input signal achieves a "steady-state" condition the comparator compares the input signal against a reference voltage and a decision register latches the comparator output. The decision signal may then be further latched to be made available for external circuitry in the subsequent clock cycle. A multi-phase programmable signal generator is connected to the clocked generator for generating a plurality of timing signals. The multi-phase programmable signal generator employs a plurality of single bit registers interconnected in series to form a shift register. Output signals generated by the programmable signal generator are used to drive the switches and register clocks of the clocked comparator.

10 Claims, 5 Drawing Sheets

APPARATUS AND METHOD FOR A HIGH FREQUENCY CLOCKED COMPARATOR AND APPARATUS FOR MULTI-PHASE PROGRAMMABLE CLOCK GENERATOR

RELATED APPLICATIONS AND PATENTS

U.S. patent application Ser. No. 09/089,099 entitled "Digital Programmable Clock Generator with Improved Accuracy," filed on May 29, 1998, and assigned to the assignee of the present invention, herein incorporated by reference.

BACKGROUND OF THE INVENTION

This invention relates to a clocked comparator and to a programmable signal generator. More particularly this invention relates to an apparatus and method for a high frequency clocked comparator and to an apparatus for a multi-phase programmable signal generator.

The basic function of a comparator is to examine a pair of signals so as to generate a comparison signal having one of two states depending on which examined signal has the largest value. In a clocked comparator the comparison occurs generally within a single clock cycle of a clock signal. The clock signal in a clocked comparator is generally a high frequency signal. Because signal evaluation typically must be completed in the first half of the clock cycle, the signals to be examined must be stable during the interval of the comparison. In a typical clocked comparator where one of the signals to be examined is fixed and the other signal (hereinafter identified as a data signal) is compared to the fixed signal, the data signal must achieve a "steady-state" condition during the first half of the clock cycle so that the comparison can be made. As such, the "settling time" of the data signal is temporally limited by the duration of the first half of the clock cycle. Alternatively, the clock cycle may be extended so as to accommodate the "setting time" of the data signal within the first half of the extended clock cycle. As such, the typical clocked comparator must operate at a slower frequency. This limitation of the typical comparator circuit is overcome by the present invention. In this Specification the "settling time" of the data signal is defined as the temporal interval required for the data signal to achieve a "steady-state" condition.

A clock generator is generally a device which produces a timing signal within a temporal period bounded by a clock cycle and having a unique wave-form. The wave-form is repeated in subsequent clock cycles. It is desirable to employ a clock generator that is simple so that it can be integrated onto an application specific integrated circuit (ASIC) at low cost. It is also desirable for the clock generator to generate a plurality of timing signals wherein each timing signal is programmable. The present invention provides a multi-phase programmable clock generator that may be implemented on a single ASIC chip.

SUMMARY OF THE INVENTION

The present invention provides a high frequency clocked comparator having two modes of operation during each cycle of a plurality of system clock cycles, including a signal acquire mode during a portion of each of said system clock cycles, and has a decision mode during another portion of each of the system clock cycles. The high frequency clocked comparator comprises several components, including a holding capacitor, a capacitor transfer switch, a capacitor charge switch, a voltage reference, a comparator feedback switch, and a decision register. The holding capacitor is coupled to the negative signal line of the comparator. The capacitor transfer switch is coupled to the holding capacitor and coupled to ground, and is adapted to provide a reference to ground for the holding capacitor during the decision mode of operation. The capacitor charge switch is coupled to the holding capacitor and coupled to the data signal line for storing charge on the holding capacitor, and is adapted to be closed during the acquire mode of operation. The voltage reference is coupled to the positive signal line of the comparator and coupled to ground for generating a voltage reference signal. The comparator feedback switch is coupled to the comparator so as to provide feedback between the comparator decision line and the positive signal line of the comparator to enable said comparator to function as a high gain operational amplifier follower during the decision mode of operation and to enable said comparator to function as a comparator during the acquire mode of operation. The decision register is coupled to the comparator decision line of the comparator, and is adapted to latch the state of the decision signal generated by the comparator during the decision mode of operation.

The present invention also provides a method of comparing two signals in a high frequency clocked comparator, comprising the steps of: configuring the clocked comparator to operate in an acquire mode and subsequently in a decision mode within one clock cycle of the clocked comparator; generating a decision signal during the acquire mode which is the summation of the data signal minus the voltage reference signal, wherein the clocked comparator is adapted to operate as a high gain operational amplifier; generating a decision signal having one of two states based on voltage level of the data signal as compared to the voltage reference signal during the decision mode; and latching the decision signal during the decision mode. The method further comprises the step of making the status of said decision signal available to external circuitry during the subsequent clock cycle.

The present invention also provides a multi-phase programmable clock generator for generating a plurality of timing signals. Each clock generator comprises: a multiplexer coupled to a respective data select line, a respective data feedback line, and a respective data line, wherein the multiplexer is adapted to select between the respective data line and the respective data feedback line based on the status of the respective data select signal. A plurality of single bit registers, called a shift register, are serially coupled together and include a first register and a last register, wherein the first register is coupled to the multiplexer and the last register is coupled to the respective feedback line so that each bit of the data signal may be latched into each one of the single bit registers on a first-in-first-out basis. Once the shift register is loaded with the data signal the multiplexer causes the contents of the shift register to be cycled through the shift register so as to generate a programmable timing signal.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Clocked Comparator

The present invention enables the "settling time" of the data signal to be increased up to approximately the entire clock cycle of a clocked comparator, thereby approximately doubling the amount of time available for the data signal to achieve a "steady-state" condition. The decision signal may then be latched by a decision register and made available for external circuitry in the subsequent clock cycle by a transition register as is further discussed below.

Figure 1:
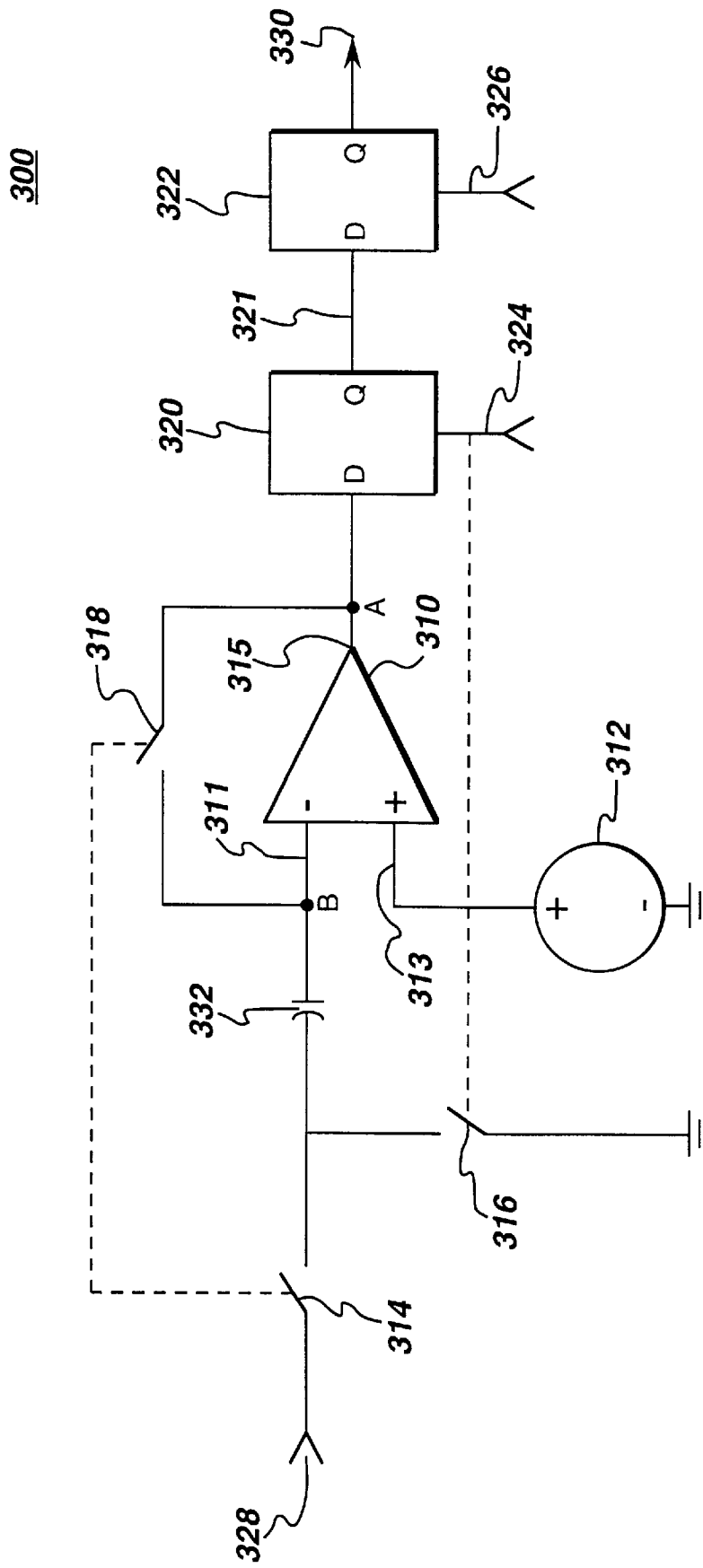
FIG. 1 is a schematic block diagram of a clocked comparator of the present invention.

A high frequency clocked comparator of the present invention is illustrated in the schematic block diagram shown in FIG. 1. A clocked comparator 300 comprises the following elements: a data signal line 328, a data transfer signal line 330; a comparator 310; a decision register 320; a transfer register 322; a holding capacitor 332; a reference voltage 312; a capacitor charge switch 314; a capacitor transfer switch 316; a decision clock signal line 324; a comparator feedback switch 318; a decision register signal line 321; and a transfer clock signal line 326. Additionally, comparator 310 comprises a negative signal line 311, a positive signal line 313, and a decision signal line 315. The above mentioned elements are interconnected as illustrated in FIG. 1.

Capacitor charge switch 314 and comparator feedback switch 318 are coupled together so that they operate in unison, that is, capacitor charge switch 314 and comparator feedback switch 318 open and close simultaneously. Additionally, capacitor transfer switch 316 is coupled to decision clock signal line 324 and operate in unison, that is, switch 316 closes when decision clock signal line 324 is active and switch 316 opens when decision clock signal line 324 is inactive.

Comparator 310 operates in two modes, including an acquire mode and a decision mode. In the acquire mode capacitor charge switch 314 and comparator feedback switch 318 are closed and capacitor transfer switch 316 is open, which enables comparator 310 to operate as a follower. In the acquire mode, comparator 310 generates a voltage on decision signal line 315 that is the summation of the voltage level at point "B" minus the voltage of voltage reference 312 multiplied by the gain of comparator 310. The voltage at point "B" corresponds to the voltage across holding capacitor 332 plus the voltage at data signal line 328.

In the decision mode, capacitor charge switch 314 and comparator feedback switch 318 are open, and capacitor transfer switch 316 is closed, which enables comparator 310 to operate as a comparator. In the decision mode comparator 310 evaluates the voltage level across holding capacitor 332 and the voltage level of reference voltage 312 and correspondingly generates a voltage at decision signal line 315 having one of two states based on the difference between the measured voltage levels.

Decision register 320 operates to latch the voltage generated by comparator 310 at decision signal line 315, hereinafter identified as decision voltage 366 (FIG. 2), and transfer register 322 operates to transfer the state of the decision signal to an external circuit, as is further discussed below. Decision register 320 is typically a D-type latch. The decision signal is latched when decision clock signal line 324 is active. The latched signal is coupled to transfer register 322 via decision register signal line 321. Decision transfer register 322 enables the state of the decision signal to be accessed by an external circuit during the subsequent clock cycle to which the decision signal was generated. Transfer register 322 is typically a D-type latch. Data transfer line 330 couples the data transfer signal to external circuitry.

Figure 2:
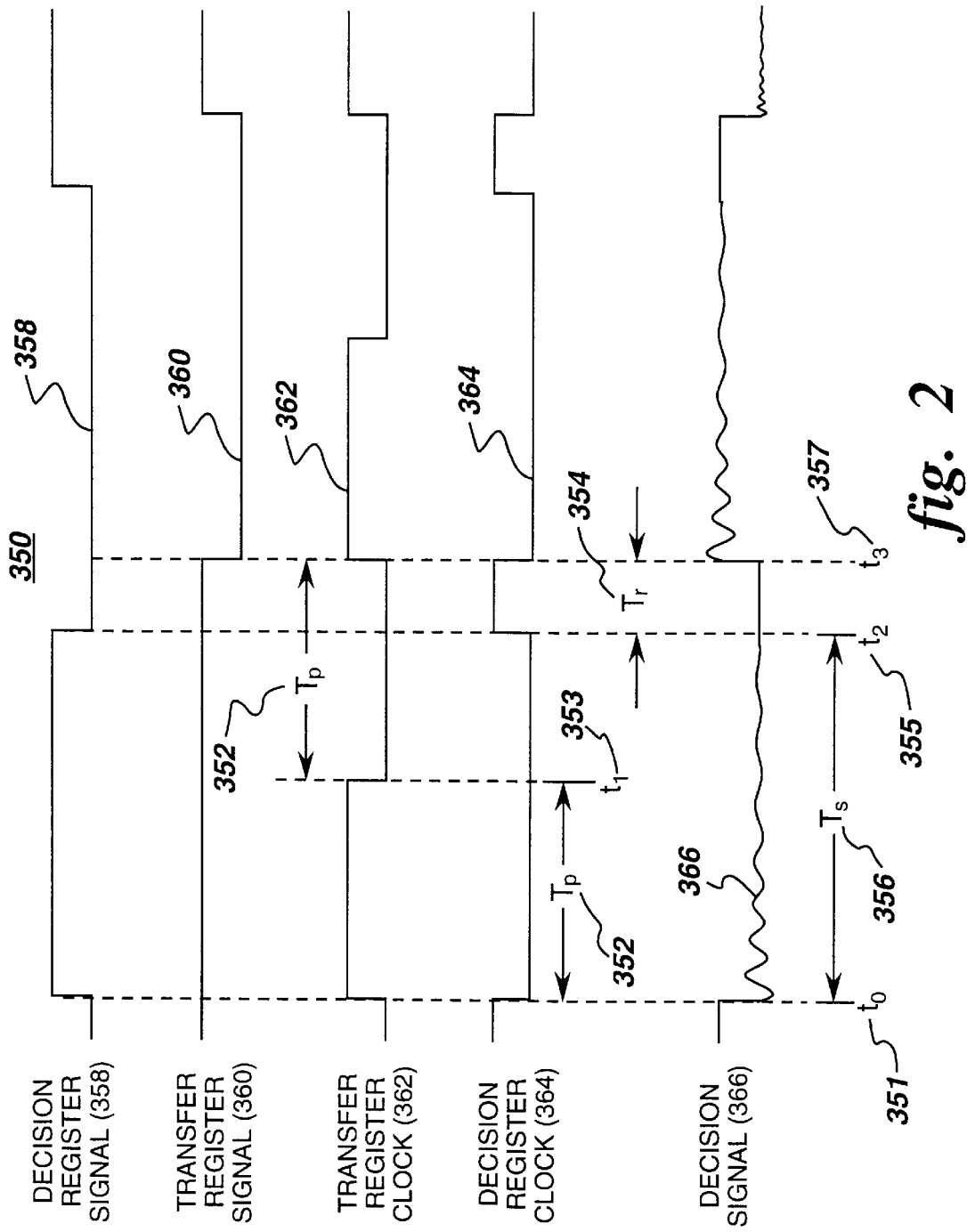
FIG. 2 is a graphical illustration of wave-forms associated with the clocked comparator of the present invention.

The wave-forms associated with clock generator 300 are graphically illustrated in FIG. 2. The first half of the clock cycle of decision register clock signal 364 is defined as $T_p$ (352). The decision interval of decision register clock signal 364 is defined as $T_r$ (354). The maximum settling interval of decision signal 366 is defined as $T_s$ (356). Decision signal 366 has a settling duration of $T_s$. The temporal interval of the acquire mode is at least equal to the duration of the settling interval of the voltage at point "B." The duration of the acquire mode is equal to the inactive interval $T_s$ of decision register clock signal 364. Transfer register clock 362 has an active interval equal to $T_p$ and an inactive signal interval equal to $T_p$. The duration of the decision mode is equal to the active interval $T_r$ of decision register clock signal 364.

Clocked comparator 300 operates so as to extend the temporal interval in which data signal 328 is acquired. This time period extension is accomplished by employing circuit elements which enable data signal 328 to extend the settling duration into the second half of the respective clock cycle of transfer clock signal line 326, and by latching the resulting decision signal 366 only at the lattermost part of the latter half of the respective clock cycle. Consequently, data signal 328 has a longer temporal interval in which to settle, enabling the clock signal period to be shorter than the clock signal would otherwise be. Next, a second latch makes the status of the decision signal available to external circuitry on the subsequent respective clock cycle of transfer clock signal line 326. The operation of clocked comparator 300 is further discussed below.

Typically, the capacitance of holding capacitor 332 is an important factor in determining the frequency of operation of clocked comparator 300. There is, however, a trade-off between the settling time of data signal 328 and the capacitance of holding capacitor 332. The settling time of data signal 328 is proportional to the capacitance of holding capacitor 332. As the value of capacitance is reduced the settling time of data signal 328 is decreased and, as such, the speed of operation of a typical clocked comparator may be increased; as the value of capacitance is increased the settling time of data signal 328 is increased. With increased capacitance, however, clocked comparator 300 is much less susceptible to errors due to thermal noise and charge injection, therefore, making an increased capacitance desirable. The present invention enables the capacitance of holding capacitor 332 to be increased to a value more than the value typically deemed necessary in a typical comparator in the art because clocked comparator 300 is more tolerant of a longer settling time of data signal 328.

The maximum time available for data signal 328 to settle is limited by the period of the clock cycle and the minimum temporal interval required to transfer decision signal 358 generated by comparator 310 to decision register 320. Output capacitance of comparator 310 and parasitic capacitance between comparator 310 and decision register 320 will negatively impact the time interval necessary to transfer a decision signal 358 (FIG. 2). The settling times of comparator 310 and decision register 320 will also negatively impact the minimum temporal interval required to transfer decision signal 358 from comparator 310 to decision register 320. Typically, the minimum temporal interval required to transfer decision signal 358 is measured in tens of nano-seconds when TTL-type circuit elements are employed. It is to be understood that the speed of operation of clocked comparator 300 including temporal interval and clock cycle times will vary as alternative circuit technology is utilized, including but not limited to emitter-coupled-logic (ETL), gallium arsenide (GaAs), transistor transistor logic (TTL), germanium silicon (GeSi), complementary metal-oxide-semiconductor (CMOS), and metal-oxide-semiconductor (MOS) technologies. In typical CMOS technologies, for example, propagation delays of integrated circuit gates range from about 0.1 to about 10.0 nano-seconds depending on the type of gate and fan out required. The maximum temporal period for data signal 328 to settle is defined as a clock cycle period minus the settling time of comparator 310 during the decision phase of decision signal 358. The transfer time of decision signal 358 is defined as the minimum temporal interval to transfer decision signal 358 from comparator 310 to decision register 322.

Transfer register 322 makes the status of decision register signal line 321 available to external circuitry on the subsequent clock cycle of transfer clock signal line 326. Transfer register 322 latches the status of decision register signal 321 during the time interval that a transfer clock signal 360 (FIG. 2) is active. Once the status of decision register signal 321 is latched it is made available on data transfer signal line 330.

The operation of clocked comparator 300 is summarized by the following process steps:

1. Close capacitor charge switch 314 and comparator feedback switch 318 and open capacitor transfer switch 316 which enable comparator 310 to operate as a follower.

2. Allow the voltage level at point "B" to reach a "steady-state" level, during the acquire mode interval. Comparator 310 is adapted to generate a voltage on decision signal line 315 that is the summation of the voltage level at voltage reference 312 plus the input offset voltage of comparator 310, during the acquire mode.

3. Open capacitor charge switch 314 and comparator feedback switch 318, and close capacitor transfer switch 316 at the initiation of the decision mode interval which enables comparator 310 to operate as a comparator. Comparator 310 is adapted to compare the voltage level across holding capacitor 332 with the voltage level of reference voltage 312 and generate a voltage at decision signal line 315 having one of two states based on the largest measured voltage level, during the decision mode.

4. Latch decision voltage 366 at decision register 320 during the interval of the decision mode by generating active decision register clock signal 364.

5. Transfer the state of decision register signal line 321 to external circuitry via data transfer line 330 during the subsequent clock cycle by generating active transfer register clock signal 362.

Multi-phase Programmable Clock Generator

Figure 3:
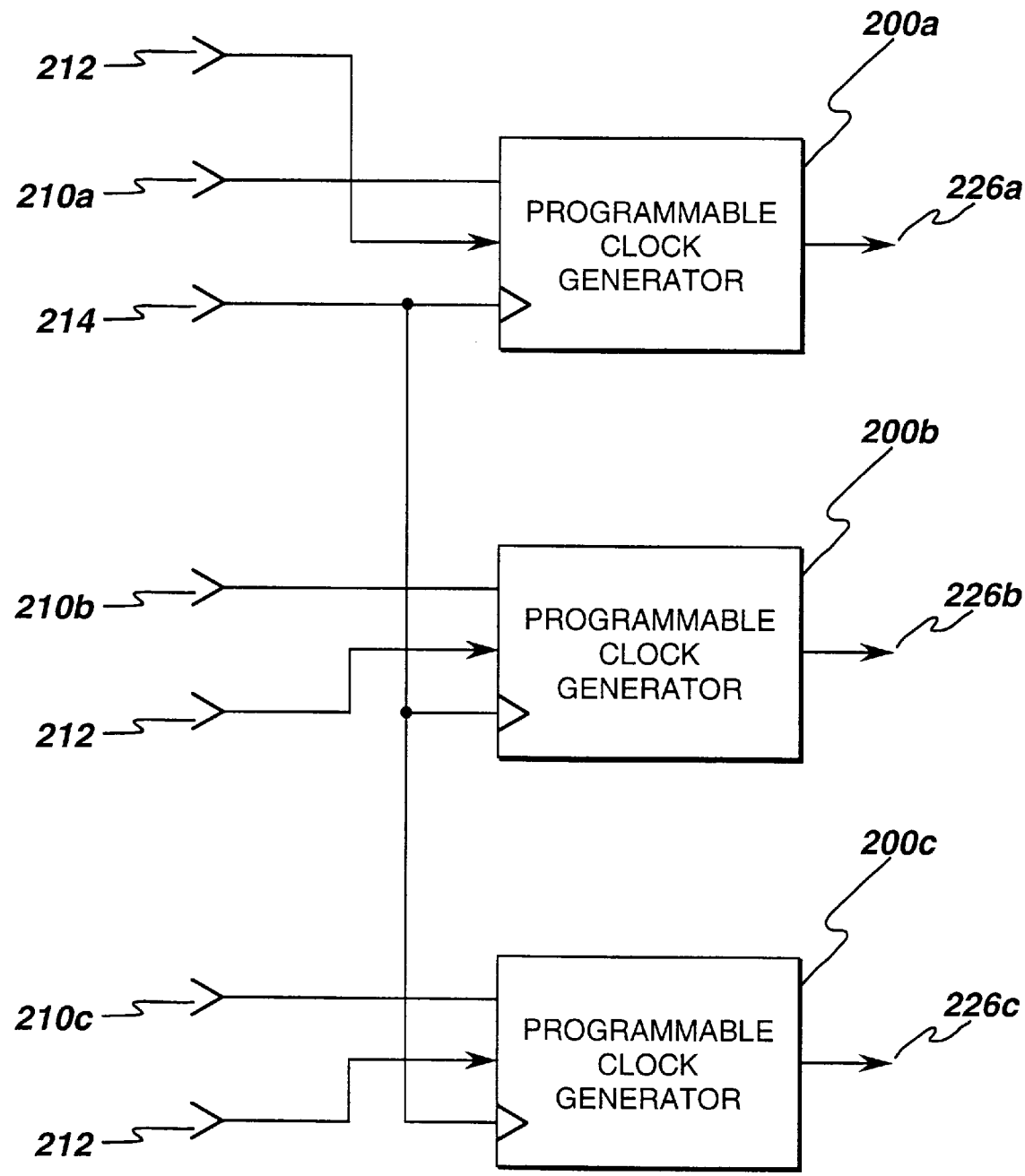
FIG. 3 is a block diagram of a multi-phase programmable clock generator of the present invention.

A block diagram of a multi-phase programmable clock generator 100 is illustrated in FIG. 3. At each of a plurality of stages the present invention generates a timing signal based on the contents of a plurality of registers which are each coupled together in series. Each set of a plurality of registers generates a timing signal having a wave-form which is repeated after being recycled through the plurality of registers. Programmable clock generator 100 comprises: a respective programmable clock generator circuit 200a, 200b, and 200c; a respective data select signal line 210a, 210b, and 210c; a data signal line 212; a clock signal line 214; and a respective clock generator signal line 226a, 226b, and 226c. It is noted that although three programmable clock generator circuits (200a, 200b, and 200c) are illustrated in FIG. 3, any number of programmable clock generator circuits 200 may be employed and is within the scope of the present invention.

Each respective programmable clock generator 200 is programmed by data signal line 212 which generates a data signal comprising a data-string, wherein the data-string comprises a plurality of logical ones and zeros. Clock signal line 214 provides a clock signal having a plurality of clock cycles which enables respective programmable clock generator 200 to synchronize the timing signals generated by clock generator signal line 226. Respective data select signal lines 210a, 210b, and 210c each generate a respective data select signal. A respective data select signal determines whether the respective programmable clock generator 200 operates in a program mode or a repeat mode. In the program mode the data-string is programmed into respective programmable clock generator 200. Alternatively, in the repeat mode the data-string is recycled through a plurality of registers as is further described below.

Figure 4:
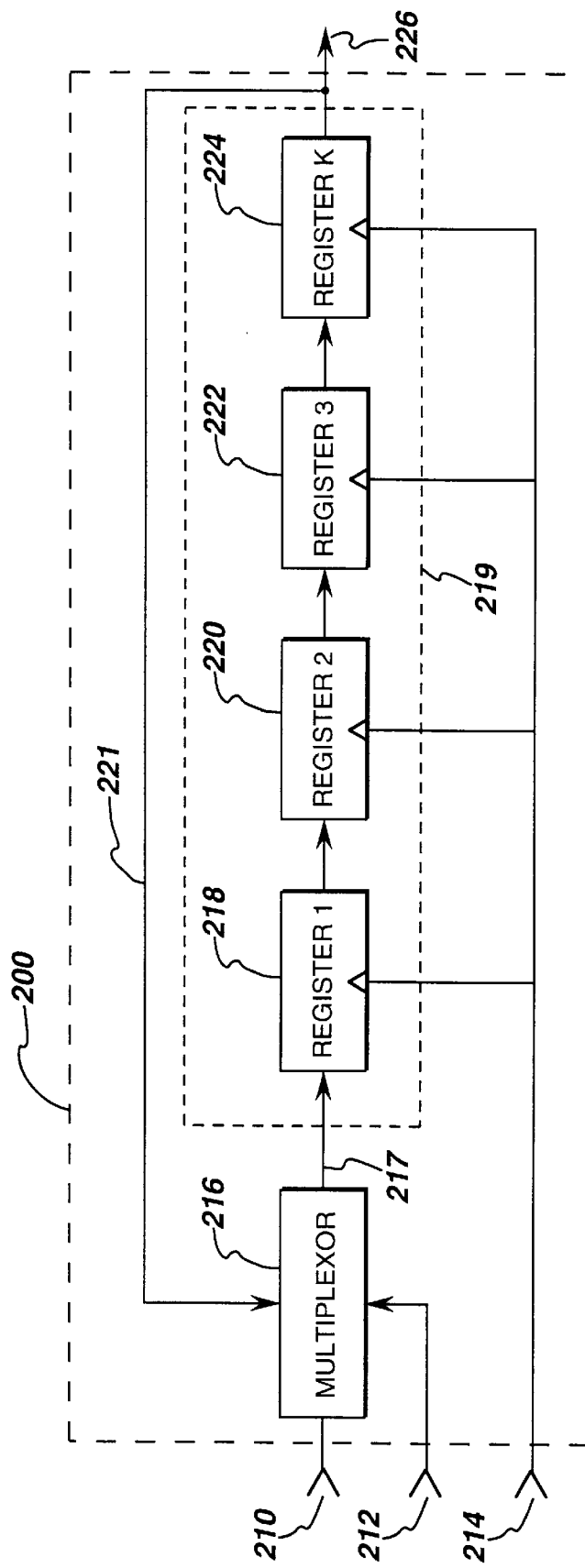
FIG. 4 is schematic block diagram of the multi-phase programmable clock generator illustrated in FIG. 3.

A schematic block diagram of programmable clock generator 200 is further illustrated in FIG. 4. Programmable clock generator 200 comprises multiplexer 216, shift register 219, data feedback line 221, and a register data signal line 217 which are coupled together as illustrated in FIG. 4. Shift register 219 comprises a plurality of registers all coupled together in series to operate as a shift register.

One example of shift register 219 is illustrated in FIG. 4, and comprises: a register 1, 218; a register 2, 220; a register 3, 222; and register "k", 224, wherein "k" is defined as the total number of registers in a shift register 219. Clock signal line 214 is coupled to each respective register 218, 220, 222, and 224. Clock generator signal line 226 is coupled to register 224. Register data signal line 217 is coupled to multiplexer 216 and to register 218.

Figure 5:
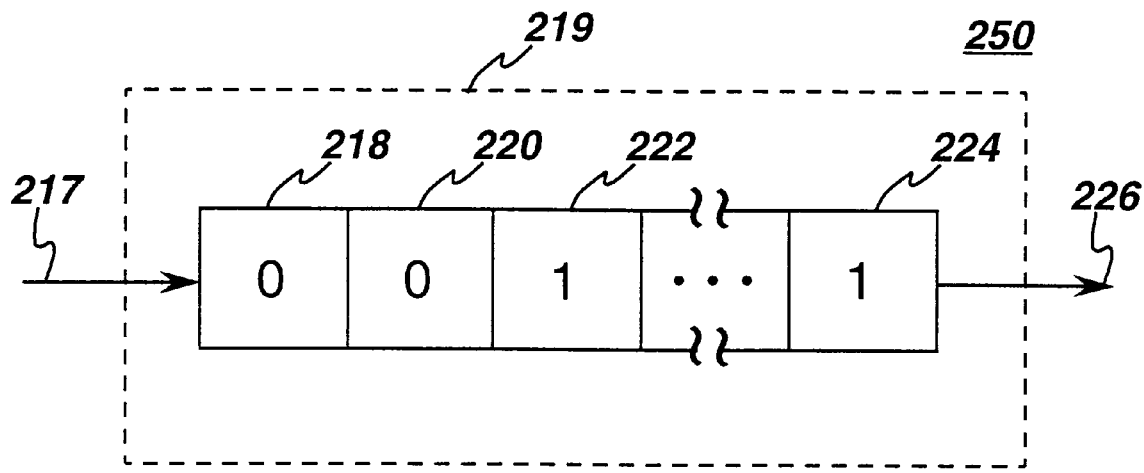
FIG. 5 is a schematic block diagram of a series of programmed registers of the multi-phase programmable clock of the present invention.

Programmable clock generator 200 operates in the program mode and alternatively in the repeat mode based on the status of data select signal line 210, wherein data select status line 210 has a program state and a repeat state. When data select signal line 210 is in the program state a first bit in the data-string from data signal line 212 is channeled into register 218 via multiplexer 216 during a first clock cycle of clock signal line 214. In the next clock cycle a second bit of the data-string is shifted into register 218 and the first bit is shifted into register 220. On subsequent clock cycles each subsequent bit of the data-string is correspondingly shifted into a register 218 and through subsequent registers 220, 222, and 224 of shift register 219 until each register 218, 220, 222, and 224 is programmed by a bit from the data-string. FIG. 5 illustrates the contents of shift register 219 given that data-string is four bits long, has a binary data signature of (0011), and is programmed into shift register 219 during the program mode.

When programmable clock generator 200 operates in the repeat mode the data-string, having previously been programmed into shift register 219, is cycled through shift register 219. Programmable clock generator 200 operates in the repeat mode when data select signal transitions to the repeat state enabling multiplexer 216 to select signal feedback line 221 rather than data signal line 212. In the repeat mode the data-string is cycled through each respective register 218, 220, 222, and 224 during each of a plurality of clock cycles. Data-string information is continuously cycled through shift register 219 as long as data select signal line 210 is in the repeat mode.

Figure 6:
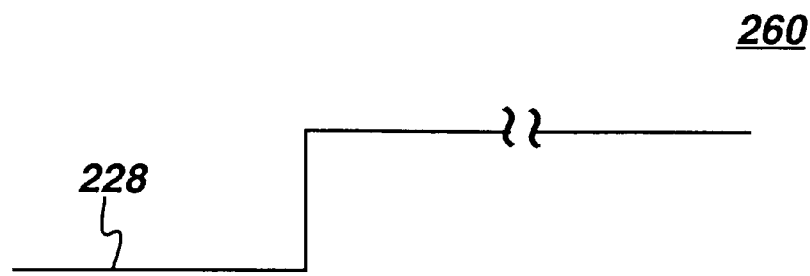
FIG. 6 is a graphical illustration of a clock generator signal generated by the programmable clock generator of the present invention when programmed as depicted in FIG. 5.

As a result of the data-string cycling through shift register 219 a clock generator signal 228 having a wave-form corresponding to the ones and zeros of the data-string is generated at clock generator signal line 226. The clock generator signal on clock generator signal line 228 repeats itself after "k" clock cycles of clock signal line 214. A graphical illustration of clock generator signal 228 is presented in FIG. 6 based on binary data-string (0011) discussed above.

Multi-phase programmable clock generator 100 provides a multi-phase programmable clock generator that may be inexpensively implemented on an ASIC. Programmable clock 100 is designed with simple digital components only, as such, programmable clock 100 may be implemented on an ASIC or any other fabrication which easily integrates digital components such as shift register 219 and multiplexer 216 utilized in the present invention.

Multi-phase programmable clock generator 100 comprises a plurality of phases, as such, a clock generator signal 228 is generated at each one of a plurality of respective clock generator signal lines 226 based on the data content of a respective data-string.

Multi-phase programmable clock generator 100 is employed for example in clocked comparator 300 to generate decision register clock signal 364 and transfer register clock signal 362. The wave-form for each of these signals is programmed into a respective shift register 219 during the program mode. During the repeat mode timing signals are generated which accomplish the required wave-forms for decision register clock signal 364 and transfer register clock signal 362 so as to enable clocked comparator 300 to function as described above.

While logical data signal levels have been described as active and correspondingly inactive, it is to be understood that logical data signal levels may alternatively be selected to be respectively inactive and correspondingly active.

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A high frequency clocked comparator having two modes of operation during each cycle of a plurality of system clock cycles, said high frequency clocked comparator having a comparator which comprises a positive signal line, a negative signal line, and a comparator decision line wherein said comparator generates a comparator decision signal, said high frequency clocked comparator also having a data signal line, said high frequency clocked comparator comprising:

a holding capacitor coupled to the negative signal line of said comparator;

said comparator having a signal acquire mode during a portion of each of said system clock cycles, and having a decision mode during another portion of each of said system clock cycles;

a capacitor transfer switch coupled to said holding capacitor and coupled to ground, wherein said capacitor transfer switch is adapted to provide a reference to ground for said holding capacitor during the decision mode of operation;

a capacitor charge switch coupled to said holding capacitor and coupled to said data signal line for storing charge on said holding capacitor, wherein said capacitor charge switch is adapted to be closed during the acquire mode of operation;

a voltage reference coupled to the positive signal line of said comparator and coupled to ground for generating a voltage reference signal;

a comparator feedback switch coupled to said comparator so as to provide feedback between the comparator decision line and the negative signal line of said comparator to enable said comparator to function as an operational amplifier follower during the acquire mode of operation and to enable said comparator to function as a comparator during the decision mode of operation;

a transfer register coupled to said decision register for latching the decision signal generated by said decision register during the portion of the system clock cycle in which the decision clock signal of said decision register is active; and a decision register coupled to the comparator decision line of said comparator, wherein said decision register is adapted to latch the state of the decision signal generated by said comparator during the decision mode of operation.

2. The clocked comparator as recited in claim 1, wherein the acquire mode of said comparator has a temporal period which is greater than one-half of the temporal period of said system clock cycle.

3. The clocked comparator as recited in claim 2, wherein the acquire mode of said comparator has a temporal period which is at most a full system clock cycle less the decision time of said comparator.

4. The clocked comparator as recited in claim 3, wherein the decision mode of said comparator has a temporal period which is at most the difference between the period of the system clock cycle and the period of the acquire mode.

5. The clocked comparator as recited in claim 4, wherein said comparator feedback switch is coupled to said capacitor charge switch, so that said comparator feedback switch and said capacitor charge switch are adapted to open and close simultaneously.

6. The clocked comparator as recited in claim 5, wherein said capacitor transfer switch is coupled to the clock of said decision register so that said decision register is adapted to latch said decision signal during said decision mode.

7. The clocked comparator as recited in claim 1, wherein said capacitor transfer switch, and said capacitor charge switch, and said comparator feedback switch are electronic switches.

8. The clocked comparator as recited in claim 1, wherein said comparator comprises a high gain operational amplifier.

9. A method of comparing a data signal and a voltage reference signal in a high frequency clocked comparator during one cycle of a clock signal, the method comprising the steps of:

configuring said clocked comparator to operate in an acquire mode and subsequently in a decision mode within one clock cycle of said clock signal;

generating a decision signal during the acquire mode which corresponds to the difference between said data signal and said voltage reference signal, wherein said clocked comparator is adapted to operate in a high gain configuration;

generating a decision signal having one of two states based on voltage level of said data signal as compared to said voltage reference signal during the decision mode;

latching said decision signal during the decision mode; and selecting an acquire mode that has a temporal duration greater than one-half cycle of said clock signal.

10. The method as recited in claim 9 further comprising the step of making the status of said decision signal available to external circuitry during the subsequent clock cycle of said clock signal.

* * * * *